(12) United States Patent
Sheredy

(10) Patent No.: US 7,062,423 B1
(45) Date of Patent: Jun. 13, 2006

(54) METHOD AND APPARATUS FOR TESTING A SYSTEM ON A CHIP (SOC) INTEGRATED CIRCUIT COMPRISING A HARD DISK CONTROLLER AND READ CHANNEL

(75) Inventor: Joseph Sheredy, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 867 days.

(21) Appl. No.: 10/042,548

(22) Filed: Jan. 9, 2002

Related U.S. Application Data

(60) Provisional application No. 60/313,829, filed on Aug. 22, 2001.

(51) Int. Cl.
| | |
|---|---|
| G06F 17/50 | (2006.01) |
| G06F 13/10 | (2006.01) |
| G06F 13/12 | (2006.01) |
| G06F 9/44 | (2006.01) |
| G06G 7/62 | (2006.01) |

(52) U.S. Cl. .............................. 703/13; 703/21; 703/19
(58) Field of Classification Search ................... 703/13
See application file for complete search history.

(56) References Cited

U.S. PATENT DOCUMENTS

| | | | |
|---|---|---|---|
| 5,610,530 A | 3/1997 | Whetsel | |
| 5,832,418 A | 11/1998 | Meyer | |
| 5,867,033 A | 2/1999 | Sporck et al. | |
| 6,075,663 A | 6/2000 | Chae | |
| 6,076,180 A * | 6/2000 | Meyer | ......................... 714/742 |
| 6,169,413 B1 | 1/2001 | Pack et al. | |
| 6,498,998 B1 * | 12/2002 | Furukawa | .................... 702/117 |
| 6,557,128 B1 * | 4/2003 | Turnquist | .................... 714/724 |
| 6,697,976 B1 * | 2/2004 | Satoh et al. | ................. 714/704 |

* cited by examiner

*Primary Examiner*—Paul L. Rodriguez
*Assistant Examiner*—Andre Pierre Louis

(57) ABSTRACT

Apparatus for testing a system on a chip (SOC) comprises a first SOC including a first hard disk controller and a first read channel. A second SOC comprises a second hard disk controller and a second read channel. An arbitrary waveform generator (AWG) generates a timing signal. An adder is provided in communication with the arbitrary waveform generator. The first SOC differentiates the timing signal received from the arbitrary waveform generator and generates a write signal in synchronization with the timing signal. The adder adds the write signal from the first SOC and the timing signal to output a combined signal having a timing signal component and a write signal component. The second SOC differentiates the timing signal component which simulates a servo signal and the write signal component simulates a signal being accessed by a read channel.

32 Claims, 3 Drawing Sheets

METHOD AND APPARATUS FOR TESTING A SYSTEM ON A CHIP (SOC) INTEGRATED CIRCUIT COMPRISING A HARD DISK CONTROLLER AND READ CHANNEL

CROSS-REFERENCE TO RELATED APPLICATIONS

This application claims priority under 35 U.S.C. 119(e) to U.S. provisional Application Ser. No. 60/313,829, entitled "Method and Apparatus for Testing a System On a Chip (SOC) Integrated Circuit Comprising a Hard Disk Controller and Read Channel", filed Aug. 22, 2001, the contents of which are incorporated by reference herein.

BACKGROUND OF THE INVENTION

1. Field of the Invention

The present invention relates to an apparatus and a method for testing a highly integrated semiconductor known as a system on a chip (SOC), and more particularly for testing a SOC comprising a hard disk controller and a read channel.

2. Description of the Related Art

In the last several decades, rapid innovation in hard disk drive technology has occurred in parallel with progress in VLSI technology and software techniques to contribute to miniaturization of hard disk drives and maximization of storage capacity. In accordance with these technology trends, it has become possible to produce a highly integrated circuit known as a system on a chip (SOC). A SOC is a single integrated circuit, i.e., one substrate, that includes functions that previously have been manifested on separate integrated circuits. One type of SOC includes a hard disk controller for a hard disk drive and a read channel for the hard disk drive.

Test circuits for systems fabricated in semiconductor chips as integrated circuits are very well known in the literature and are the subject of many patents. Likewise, hard disk drives, disk controllers, and read channels for hard disk drives are very well known in the literature. For example, see U.S. Pat. Nos. 5,867,033; 5,610,530; 6,075,663; 6,169,413; 5,832,418; and 6,076,180, the contents of each of which are incorporated herein by reference.

Conventionally, the hard disk controller and the read channel have been fabricated in separate semiconductor chips. One problem that has arisen because of this integration on separate chips is that of testing the SOC. A conventional approach to testing the SOC requires the use of an actual hard disk assembly (HDA). This approach has numerous drawbacks. One drawback is the expense associated with using HDA's. A second drawback is the unavailability of the HDA because it is generally being developed simultaneously as the SOC is being developed. A third drawback is the impracticality of testing a SOC with an HDA during the mass production phase. A fourth drawback is that because the HDA is a mechanical hardware device, it is likely to encounter mechanical glitches that make it less reliable for testing purposes. These drawbacks have generated a need for an improved approach to testing a SOC that includes a hard disk controller and a read channel.

SUMMARY OF THE INVENTION

The present invention is intended to address the need for a system in which a SOC, including a hard disk controller and a read channel for a hard disk drive, can be tested effectively without the need for a hard disk assembly.

In accordance with a first aspect of the present invention, an apparatus is provided for testing a system on a chip (SOC). The apparatus comprises a first SOC comprising a first hard disk controller and a first read channel. A second SOC comprises a second hard disk controller and a second read channel, and an arbitrary waveform generator (AWG) generates a timing signal. An adder is provided in communication with the arbitrary waveform generator. The first SOC differentiates the timing signal received from the arbitrary waveform generator, and the first SOC generates a write signal in synchronization with the timing signal. The adder adds the write signal from the first SOC and the timing signal to output a combined signal having a timing signal component and a write signal component. The second SOC differentiates the timing signal component which simulates a servo signal and the write signal component simulates a signal being accessed by a read channel.

In accordance with a second aspect of the present invention the apparatus comprises a first host to control the first SOC and a second host to control the second SOC.

In accordance with a third aspect of the present invention the first SOC is the same as the second SOC.

In accordance with a fourth aspect of the present invention, the output of the AWG is received by the first read channel.

In accordance with a fifth aspect of the present invention, the output of the adder is received by the second read channel.

In accordance with a sixth aspect of the present invention, a method is provided to test a first system on a chip (SOC). The method comprises the steps of generating a timing signal, differentiating the timing signal, generating a write signal in synchronization with the differentiated timing signal by a second SOC, adding the write signal and the timing signal together to produce a combined signal having a write signal component and a timing signal component. The timing signal component simulates a servo signal, and the write signal component simulates a signal being accessed by a read channel. The timing signal component and the write signal component is inputted to the first SOC.

In accordance with a seventh aspect of the present invention, a first host is used for controlling the first SOC and a second host is used for controlling the second SOC.

In accordance with a eighth aspect of the present invention, a method is provided to test a first system on a chip (SOC), with a second SOC. The method comprising the steps of connecting an output of a signal generator to an input of a read channel portion of the second SOC, connecting an output of a write driver portion of a first SOC to a first input of a summing circuit, connecting the output of the signal generator to a second input of a summing circuit; and connecting the output of the adding circuit to an input of a read channel portion of the first SOC.

In accordance with a ninth aspect of the present invention, the signal generator generates a write signal in synchronization with the timing signal.

In accordance with a ninth aspect of the present invention, the summing circuit adds the write signal and the timing signal together to produce a combined signal having a write signal component and a timing signal component.

In accordance with a tenth aspect of the present invention, the second SOC differentiates the timing signal component of the combined signal, the timing signal component simulates a servo signal, and the write signal component simulates a signal being accessed by a read channel.

In accordance with an eleventh aspect of the present invention, the first SOC comprises a write driver to generate the write signal.

In another aspect, the invention provides a storage medium for storing software for testing a system on a chip (SOC), the SOC comprising a read channel for a hard disk drive and a disk controller. The software is computer-readable. The software includes instructions for causing a computer to program a first SOC; program a second SOC to be identical to the first SOC; generate a simulated timing signal and transmit the simulated timing signal to the first SOC; use the first SOC to generate a simulated write signal while using the received simulated timing signal for synchronization; combine the simulated timing signal and the simulated write signal together to produce a simulated combined signal that includes a timing signal component and a write signal component; transmit the simulated combined signal to the second SOC; use the second SOC to differentiate the timing signal component such that the differentiated timing signal component simulates a servo signal; and use the second SOC to interpret the write signal component as simulating a signal being accessed by a read channel for a hard disk drive.

The software may also include instructions for causing a computer to use the second SOC to differentiate the timing signal component with respect to two orthogonal variables, or it may include instructions for causing a computer to use the second SOC to differentiate the timing signal component with respect to a single time variable. The simulated timing signal may include a simulated periodic square wave signal. The simulated write signal may include a plurality of simulated sequential signal bursts. One or more of the simulated sequential signal bursts may be divided into two or more separate parts as a result of the synchronization with the simulated timing signal. The software may include instructions for causing a computer to program both the first SOC and the second SOC using the same Error Control Code (ECC) program. The ECC program may include a write long command.

In yet another aspect, the invention provides a storage medium for storing software for testing a read function in a SOC, the SOC comprising a read channel for a hard disk drive and a disk controller. The software is computer-readable. The software includes instructions for causing a computer to program a SOC; generate a simulated timing signal; generate a simulated write signal while using the simulated timing signal for synchronization; combine the simulated timing signal and the simulated write signal together to produce a simulated combined signal that includes a timing signal component and a write signal component; transmit the combined signal to the SOC; use the SOC to differentiate the timing signal component such that the differentiated timing signal component simulates a servo signal; and use the SOC to interpret the write signal component as simulating a signal being accessed by a read channel for a hard disk drive.

In still another aspect, the invention provides a storage medium for storing software for testing a write function in a SOC, the SOC comprising a read channel for a hard disk drive and a disk controller. The software is computer-readable. The software includes instructions for causing a computer to program a SOC; generate a timing signal; transmit the timing signal to the SOC; use the SOC to generate a write signal while using the received timing signal for synchronization; combine the timing signal and the write signal together to produce a combined signal that includes a timing signal component and a write signal component; transmit the combined signal to a reader; and use the reader to read the write signal component from the combined signal.

DETAILED DESCRIPTION OF THE INVENTION

The present invention addresses the need for a system in which a SOC including a hard disk controller, a read channel and a write driver can be tested effectively without the need for a hard disk assembly. By overcoming the need for using a hard disk assembly in testing a SOC, the inventor has created a faster, more efficient, more flexible, and more reliable way to test a SOC. In the development of the present invention, the inventor has recognized that use can be made of two identical SOCs to simulate the hard disk assembly, including a servo signal for timing, and thereby test the read and write functions of both SOCs.

Figure 1:
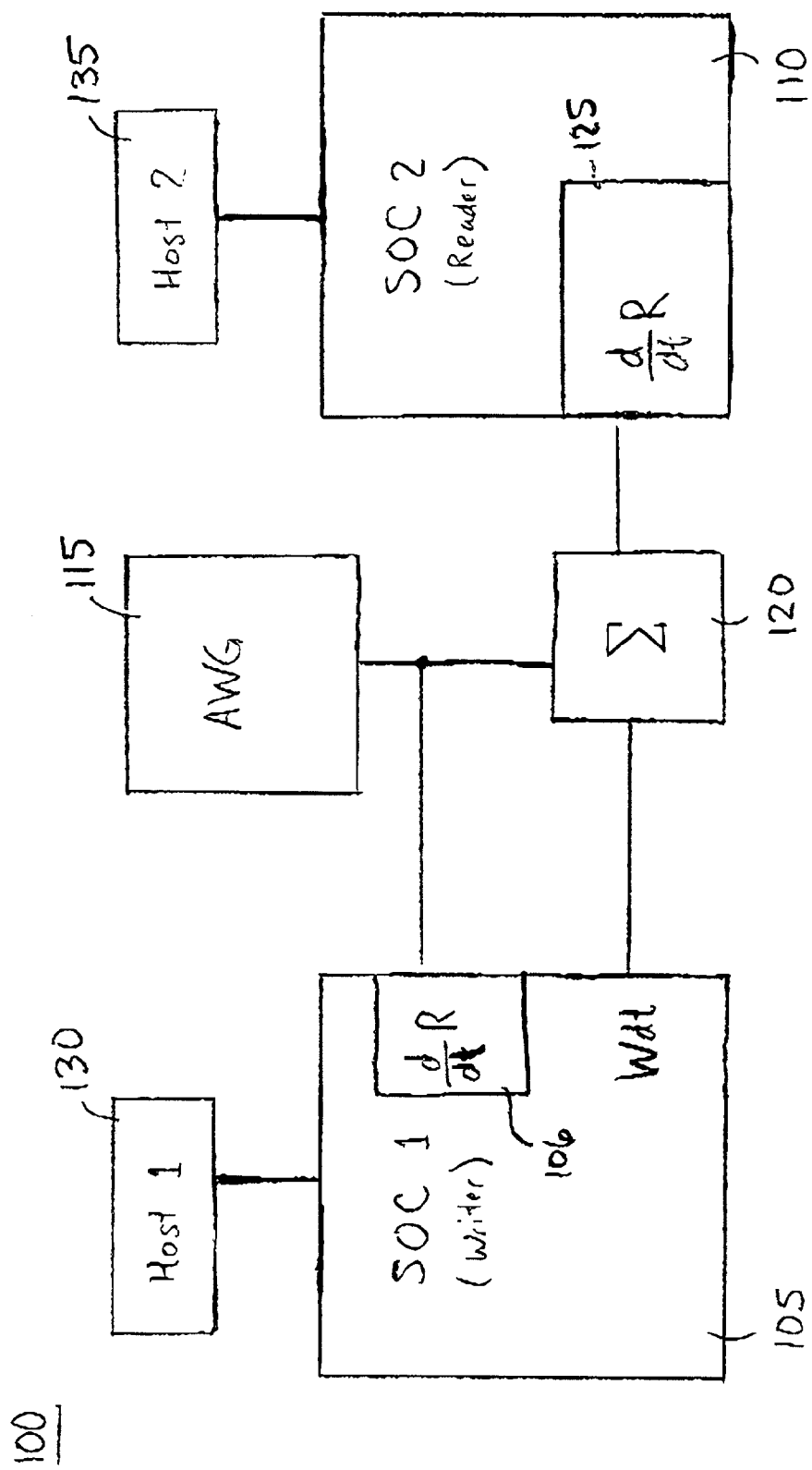
FIG. 1 shows a circuit architecture for testing a SOC according to the present invention.

Referring to FIG. 1, in accordance with a preferred embodiment of the present invention, a circuit arrangement 100 for testing the read and write functions of a SOC comprising a hard disk controller, a read channel and a write driver is shown. The circuit 100 includes a first SOC 105 and a second SOC 110. The first SOC 105 is controlled by a first host computer 130, and the second SOC is controlled by a second host computer 135. Both SOCs 105 and 110 are programmed using identical program code as each other. An arbitrary waveform generator (AWG) 115 is connected to both a read channel input of the first SOC 105 and to an adder 120. The AWG 115 is used to generate a timing signal that simulates a servo signal in the test. The timing signal is received by a differentiator component 106 within the first SOC 105. The differentiator 106 is configured to perform the differentiation operation with respect to time (e.g., the operation is represented as "d/dt"). The first SOC 105 generates a write signal synchronized with the timing signal at the output of the write driver. The adder 120 receives the write signal from SOC 105 as one input and receives the timing signal transmitted by the AWG 115 as a second input. The adder 120 combines the timing signal and the write signal and outputs this combined signal by transmitting it to the read channel input of the second SOC 110. This signal would correspond to a signal from a hard disk assembly (HDA), when an HDA is being used. The combined signal is received by a differentiator component 125 within the second SOC 110. The differentiator 125 is configured to perform the differentiation operation with respect to time (e.g., the operation is represented as "d/dt"). It is noted that the differentiators 106 and 125 may be situated outside of the respective SOCs 105 and 110.

Figure 2:
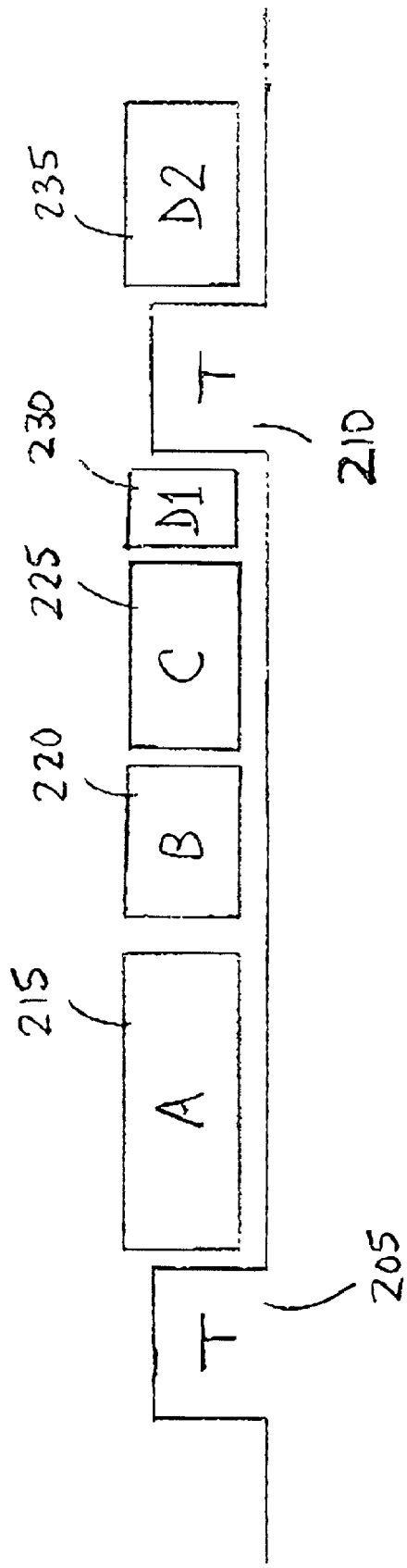
FIG. 2 shows an exemplary adder output signal, a combined timing signal and write signal, to be used as a test signal according to the present invention.

Referring also to FIG. 2, an exemplary combined signal that would be outputted by the adder 120 is shown. The combined signal has two components, the timing signal component generated by the AWG 115 and the write signal component generated by the first host computer 130 and transmitted by the first SOC 105. The timing signal component is shown as a periodic pulsed signal. Within each pulsed signal, the timing signal is actually composed of a series of periodic and non-periodic transitions which describe rotational position in an encoded format. A first pulse 205 is transmitted, then a regular interval between pulses occurs, then a second pulse 210 is transmitted, then the same interval occurs, and the pattern repeats. The write signal is shown as a series of separate signals A 215, B 220, C 225, D1 230, and D2 235. The D1 signal 230 and the D2 signal 235 is a "split" signal D in that it has been generated by the first host computer 130 so as to not interfere with the timing signal pulse 210. Because the timing signal is received by the first SOC 105 from the AWG 115, the first host computer 130 can use the timing signal in order to synchronize with the timing signal in the process of generating the write signal.

In general, a SOC operates in either a timing mode (also referred to as servo mode) or a data mode, but not in both modes at once. When a SOC is operating in conjunction with a hard disk assembly, the SOC is in timing mode (or servo mode) when the servo is providing the servo wedge for synchronization, and the SOC does not normally write data while in this mode. Therefore, the first SOC 105 is operating in the timing mode when it first receives the timing signal from the AWG 115, prior to generation of the write signal. Once the SOC 105 has been synchronized to the timing signal, it enters the data mode, and the first host computer 130 generates the write signal, and the SOC 105 transmits the write signal to the adder 120.

Figure 3:
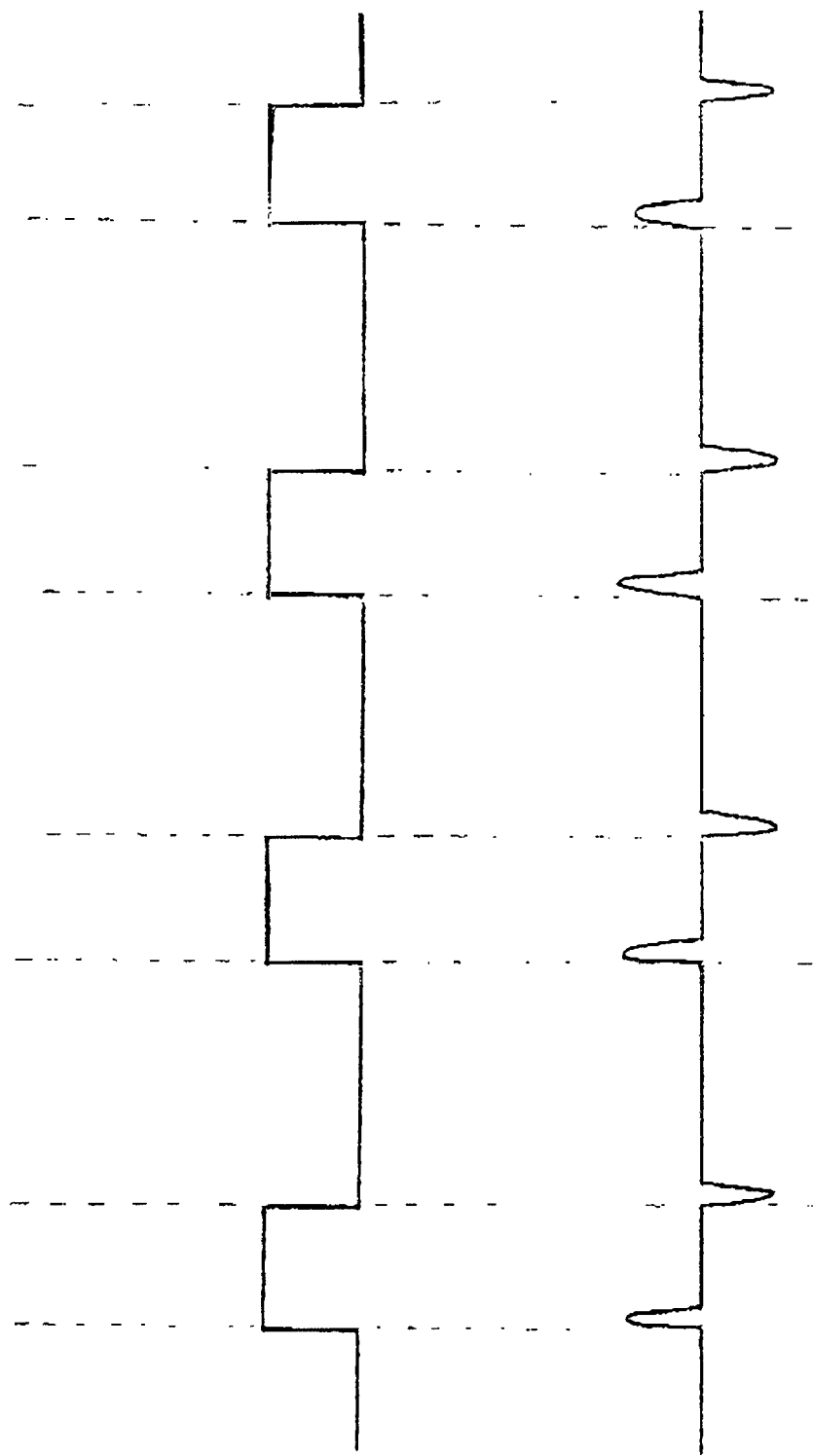
FIG. 3 illustrates a graph of an exemplary timing signal and a graph of a simulated servo signal resulting from a differentiation of the exemplary timing signal.

Referring to FIG. 3, the timing signal component is shown in the top graph as a periodic square wave, and a result of differentiation of the timing signal component is shown in the bottom graph. While the timing signal shown here is a periodic square wave, it is done so only for ease of description. The actual timing signal is composed of both periodic and non-periodic transitions. Because the differentiated signal strongly resembles the type of signal that would be transmitted by a servo in a hard disk assembly, the differentiated signal simulates a servo signal, as is well known in the art, in this manner.

Referring again to FIG. 2, the write signals A 215, B 220, C 225, D1 230, and D2 235 thus simulate the output of a hard disk assembly. In this manner, the write function of the first SOC 105 and the read function of the second SOC 110 are tested. Because both SOCs are loaded with the same program code, testing the read function of one SOC is equivalent to testing the read function of both SOCs, and testing the write function of one SOC is equivalent to testing the write function of both SOCs.

The described embodiment has broad applications. The applications are generally represented as the various types of program code (often referred to as blocks) that are loaded into the SOCs 105 and 110. For example, the invention may be used to test an Error Control Code (ECC) block without the necessity of the hard disk assembly. For ECC testing, the "write long" command is employed for generating the write signal.

It is hereby noted that the best mode of the present invention entails the use of a pair of the same or even identically programmed SOCs, one functioning as a "writer" SOC and the other functioning as a "reader" SOC. However, while the present invention has been described with respect to what is presently considered to be the preferred embodiment, i.e., a test arrangement using a pair of SOCs, it is to be understood that the invention is not limited to the disclosed embodiments. To the contrary, the invention is intended to cover various modifications and equivalent arrangements included within the spirit and scope of the appended claims. For example, it is to be understood that the invention is applicable to test arrangements using one SOC as either a "writer" or a "reader" and some other circuitry in place of the second SOC. The invention also may be implemented via an appropriately programmed general purpose computer. The scope of the following claims is to be accorded the broadest interpretation so as to encompass all such modifications and equivalent structures and functions.

What is claimed is:

1. An apparatus for testing a system on a chip (SOC), the apparatus comprising:
   a first SOC comprising a first hard disk controller and a first read channel;
   a second SOC comprising a second hard disk controller and a second read channel;
   an arbitrary waveform generator (AWG) to generate a timing signal; and
   an adder in communication with the arbitrary waveform generator,
   wherein the first SOC differentiates the timing signal received from the arbitrary waveform generator,
   wherein the first SOC generates a write signal in synchronization with the timing signal,
   wherein the adder adds the write signal from the first SOC and the timing signal to output a combined signal having a timing signal component and a write signal component; and
   wherein the second SOC differentiates the timing signal component which simulates a servo signal and the write signal component which simulates a signal being accessed by a read channel.

2. The apparatus of claim 1, further comprising a first host to control the first SOC and a second host to control the second SOC.

3. The apparatus of claim 1, wherein the first SOC is the same as the second SOC.

4. The apparatus of claim 1, wherein the output of the AWG is received by the first read channel.

5. The apparatus of claim 1, wherein the output of the adder is received by the second read channel.

6. An apparatus for testing a system on a chip (SOC), the apparatus comprising:
   a first SOC comprising a first hard disk controller and a first read channel;
   a first differentiator;
   a second SOC comprising a second hard disk controller and a second read channel;
   a second differentiator;
   an arbitrary waveform generator (AWG) to generate a timing signal; and
   an adder in communication with the arbitrary waveform generator,
   wherein the first differentiator differentiates the timing signal received from the arbitrary waveform generator,
   wherein the first SOC generates a write signal responsive to the first differentiator and in synchronization with the timing signal,
   wherein the adder adds the write signal from the first SOC and the timing signal to output a combined signal having a timing signal component and a write signal component,
   wherein the second differentiator differentiates the timing component responsive to the adder, and
   wherein in the second SOC, the differentiated timing signal component from the second differentiator simulates a servo signal and the write signal component simulates a signal being accessed by a read channel.

7. The apparatus of claim 6, further comprising a first host to control the first SOC and a second host to control the second SOC.

8. The apparatus of claim 6, wherein the first SOC is the same as the second SOC.

9. The apparatus of claim 6, wherein the output of the AWG is received by the first read channel.

10. The apparatus of claim 6, wherein the output of the adder is received by the second read channel.

11. An apparatus for testing a system on a chip (SOC), the apparatus comprising:
a first SOC comprising first means for controlling a hard disk and first means for reading data included on a hard disk;
a second SOC comprising second means for controlling a hard disk and a second means for reading data included on a hard disk;
means for generating a timing signal; and
means for adding input signals, the means for adding being in communication with the means for generating,
wherein the first SOC differentiates the timing signal received from the generating means,
wherein the first SOC generates a write signal in synchronization with the timing signal,
wherein the means for adding adds the write signal from the first SOC and the timing signal to output a combined signal having a timing signal component and a write signal component; and
wherein the second SOC differentiates the timing signal component which simulates a servo signal and the write signal component simulates a signal being accessed by means for reading data included on a hard disk.

12. The apparatus of claim 11, further comprising first host means for controlling the first SOC and second host means for controlling the second SOC.

13. The apparatus of claim 11, wherein the first SOC is the same as the second SOC.

14. The apparatus of claim 11, wherein the output of the means for generating the timing signal is received by the first means for reading data.

15. The apparatus of claim 11, wherein the output of the means for adding is received by the second means for reading data.

16. An apparatus for testing a system on a chip (SOC), the apparatus comprising:
a first SOC comprising first means for controlling a hard disk and first means for reading data included on a hard disk;
first means for differentiating an input signal;
a second SOC comprising second means for controlling a hard disk and second means for reading data included on a hard disk;
second means for differentiating an input signal;
means for generating a timing signal; and
means for adding input signals, the means for adding being in communication with the means for generating,
wherein the first means for differentiating differentiates the timing signal received from the means for generating,
wherein the first SOC generates a write signal responsive to the first means for differentiating and in synchronization with the timing signal,
wherein the means for adding adds the write signal from the first SOC and the timing signal to output a combined signal having a timing signal component and a write signal component,
wherein the second means for differentiating differentiates the timing component responsive to the means for adding, and
wherein in the second SOC, the differentiated timing signal component from the second means for differentiating simulates a servo signal and the write signal component simulates a signal being accessed by means for reading data included on a hard disk.

17. The apparatus of claim 16, further comprising first host means for controlling the first SOC and a second host means for controlling the second SOC.

18. The apparatus of claim 16, wherein the first SOC is the same as the second SOC.

19. The apparatus of claim 16, wherein the output of the means for generating the timing signal is received by the first means for reading data.

20. The apparatus of claim 16, wherein the output of the means for adding is received by the second means for reading data.

21. A method of testing a first system on a chip (SOC), the method comprising the steps of:
generating a timing signal;
differentiating the timing signal;
generating a write signal in synchronization with the differentiated timing signal by a second SOC;
adding the write signal and the timing signal together to produce a combined signal having a write signal component and a timing signal component,
wherein the timing signal component simulates a servo signal, and the write signal component simulates a signal being accessed by a read channel; and
inputting to the first SOC the timing signal component and the write signal component.

22. The method of claim 21, wherein the first SOC is the same as the second SOC.

23. The method of claim 21, wherein a first host is used for the first SOC and a second host is used for controlling the second SOC.

24. A method of testing a first system on a chip (SOC), with a second SOC, the method comprising the steps of:
connecting an output of a signal generator to an input of a read channel portion of the first SOC;
connecting an output of a write driver portion of the first SOC to a first input of a summing circuit;
connecting the output of the signal generator to a second input of a summing circuit; and
connecting the output of the adding circuit to an input of a read channel portion of the second SOC.

25. The method of claim 24, wherein the signal generator generates a write signal in synchronization with the timing signal.

26. The method of claim 25, wherein the summing circuit adds the write signal and the timing signal together to produce a combined signal having a write signal component and a timing signal component.

27. The method of claim 26, wherein the second SOC differentiates the timing signal component of the combined signal, wherein the timing signal component simulates a servo signal, and wherein the write signal component simulates a signal being accessed by a read channel.

28. The method of claim 24, wherein the first SOC is the same as the second SOC.

29. The apparatus of claim 1, wherein the first SOC comprises a write driver to generate the write signal.

30. The apparatus of claim 6, wherein the first SOC comprises a write driver to generate the write signal.

31. The apparatus of claim 11, wherein the first SOC comprises a write driver means for generating the write signal.

32. The apparatus of claim 16, wherein the first SOC comprises a write driver means for generating the write signal.

* * * * *

UNITED STATES PATENT AND TRADEMARK OFFICE
CERTIFICATE OF CORRECTION

| | |
|---|---|
| PATENT NO. | : 7,062,423 B1 |
| APPLICATION NO. | : 10/042548 |
| DATED | : June 13, 2006 |
| INVENTOR(S) | : Joseph Sheredy |

It is certified that error appears in the above-identified patent and that said Letters Patent is hereby corrected as shown below:

Col. 8
Claim 23, Line 45:     Insert -- controlling -- after "for"
Claim 23, Line 45:     Insert -- controlling -- before "the"

Signed and Sealed this

Fifth Day of December, 2006

JON W. DUDAS
*Director of the United States Patent and Trademark Office*